United States Patent
Matsubara et al.

(10) Patent No.: US 6,268,090 B1
(45) Date of Patent: Jul. 31, 2001

(54) PROCESS FOR MANUFACTURING SEMICONDUCTOR DEVICE AND EXPOSURE MASK

(75) Inventors: Yoshihisa Matsubara; Kazumi Sugai; Nobukazu Ito; Kazuyoshi Ueno, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/512,352

(22) Filed: Feb. 24, 2000

(30) Foreign Application Priority Data

Feb. 25, 1999 (JP) .................................................. 11-048624

(51) Int. Cl.[7] ...................................................... G03F 9/00
(52) U.S. Cl. ............................................................... 430/5
(58) Field of Search ............................... 430/5, 322, 394; 438/626

(56) References Cited

U.S. PATENT DOCUMENTS 5,854,125 * 12/1998 Harvey .................................. 438/626

* cited by examiner

Primary Examiner—S. Rosasco
(74) Attorney, Agent, or Firm—Young & Thompson

(57) ABSTRACT

In a process for manufacturing a semiconductor device where a plurality of wafers are formed on a single wafer, comprising the steps of forming a groove pattern in an insulating layer on a wafer; forming a seed metal layer in the groove by spattering; depositing an interconnection metal layer on the seed metal layer by electrolytic plating; and then flattering the wafer to the surface of the insulating layer, during forming the groove pattern in the insulating layer, the groove pattern is formed in the area on the wafer where devices can be taken while forming a dummy pattern up to 30 µm long in the wafer periphery where devices cannot be taken, to prevent the interconnection metal layer from being peeled in the wafer periphery.

7 Claims, 9 Drawing Sheets

109

(Prior Art)

PROCESS FOR MANUFACTURING SEMICONDUCTOR DEVICE AND EXPOSURE MASK

BACKGROUND OF THE INVENTION

1. Field of the Invention

This invention relates to a process for manufacturing a semiconductor device. In particular, it relates to a process for manufacturing a semiconductor device using a damascene method where an interconnection is formed by burying an interconnection metal in a groove on an insulating layer, especially a copper damascene. This invention also relates to an exposure mask optimized for the process.

2. Description of the Related Art

Aluminum has been frequently used as an interconnection layer in a semiconductor device. However, it has been recently proposed to use Cu exhibiting a lower resistance as an interconnection material, and in some cases, it has been practically used.

Due to difficulty in dry-etching copper, photolithography cannot be used for patterning the copper interconnection as is in a conventional aluminum interconnection. Therefore, the copper interconnection is generally formed by burying copper in a groove on an interlayer insulating film and then flattening the surface(a damascene method).

In a common process for manufacturing a semiconductor device a plurality of semiconductor devices is simultaneously formed on a single wafer, and then divided into individual semiconductor device. A wafer has increasingly become larger particularly for reducing a cost. Now, a wafer with a diameter of 200 mm is commonly used, and a mounting technique to a wafer with a diameter of 300 mm is going to be established.

Such a trend holds true for forming a buried interconnection such as a copper interconnection. Specifically, copper is buried in a groove by forming a groove pattern for burying copper on a sheet of wafer; forming a barrier metal layer and a seed metal layer by spattering; depositing a thick copper layer by an appropriate technique such electrolytic plating; and then flattering the surface.

A groove pattern is formed by forming an insulating layer such as a silicon oxide film on, for example, a silicon wafer; applying a photoresist on the insulating film; exposing and developing an individual wafer to form a resist pattern; and etching the insulating layer by anisotropic etching such as dry etching using the resist pattern as a mask.

In the process, an exposure pattern has been formed by exposing the wafer using a mask corresponding to an interconnection pattern(the first mask 2) in an area of the wafer 1 where devices can be taken to form the interconnection pattern while using a mask such as a ground glass without a pattern(a blank mask 4) in the periphery of the wafer where devices cannot be taken for no-pattern exposure (i.e., exposure leaving no resist patterns) as illustrated in FIG. 6, or exposing the whole surface of the wafer using only the first mask 2 corresponding to the above interconnection pattern to form only the interconnection pattern as illustrated in FIG. 7.

FIGS. 8 and 9 are process cross-sections illustrating a wafer edge during forming a copper interconnection, where the whole surface is exposed using the first mask corresponding to an interconnection pattern. Herein, a case where the first interconnection layer is made of copper will be described.

An insulating film 102 is deposited on a silicon substrate 101 having a transistor(unshown) and a contact hole (unshown) (FIG. 8(A)). On the film is deposited a stopper film 103 such as an SiN film to a thickness of about 50 nm, on which is then deposited a flat insulating film 104 consisting of a silicon oxide to a thickness of about 400 nm for forming a groove in which copper is to be buried. On the film, a positive photoresist is applied. Then, the surface is exposed using only the mask having the reversed interconnection pattern as illustrated in FIG. 7 and developed to leave a resist pattern in the exposed area(unshown). The flat insulating film 104 is etched using the resist pattern as a mask to form a groove pattern as shown in FIG. 8(B).

Then, the substrate having the groove pattern is placed in a spattering equipment. On the substrate are deposited by spattering a barrier film 105 consisting of a high-melting metal nitride such as TaN to about 20 nm and then a Cu film 106 to about 100 nm. During the process, the periphery of the wafer is held by a clamp 107 as shown in FIG. 8(C) for preventing the materials from going around to the rear face of the wafer. The clamp 107 covers the periphery to about 3 mm from the wafer edge, and has an overhang-eaves end for preventing the clamp from being connected with the substrate via the material deposited by spattering.

As illustrated in FIG. 9(A), copper particles 108 splashed during depositing copper adhere to the area under the end eaves of the clamp. The adhering copper particles 108 are significantly fewer adherents to the base layer than the Cu film 106 deposited by spattering.

Then, copper is deposited by an appropriate technique such as electrolytic plating to a thickness of 800 nm, during which plated copper 109 grows around the adhering copper particles 108 and finally is joined with the plated copper 109 deposited on the spattered copper film 106 (FIG. 9(B)).

Subsequently, the plated copper 109, the spattered copper 106 and the barrier film 105 are polished by CMP until the surface of the groove oxide film 104 is exposed, the surface is flattened, and thereby copper is buried in the groove.

However, since the plated copper 109 around the copper particles 108 is less adhesive, peeling may occur during the CMP process as shown in FIG. 9(C). Then, the peeled part may be separated when the wafer is reloaded on a wafer carrier to adhere to an area between interconnection patterns, causing interconnection short-circuit, or some peeled parts may adhere to the wafer carrier, leading to contamination of other wafers. These problems may be more prominent when exposing the periphery shown in FIG. 6 without a pattern.

Furthermore, the larger a wafer is, the longer the peripheral length of the wafer is and thus the more frequent the problems occur.

SUMMARY OF THE INVENTION

An objective of this invention is to provide a process for manufacturing a semiconductor device comprising a buried copper interconnection in which the above problem of peeling does not occur.

We have intensely investigated to solve the above problems and have finally found that peeling can be avoided by conducting exposure using a mask comprising a given pattern in the area corresponding to a wafer periphery where devices cannot be taken, to form a given shape of dummy pattern, in which copper is then buried.

Thus, this invention provides a process for manufacturing a semiconductor device where a plurality of wafers is formed on a single wafer, comprising the steps of forming a groove pattern in an insulating layer on a wafer; forming a seed metal layer in the groove by spattering; depositing an interconnection metal layer on the seed metal layer by electrolytic plating; and then flattering the wafer to the surface of the insulating layer, wherein during forming the groove pattern in the insulating layer, the groove pattern is formed in the area on the wafer where devices can be taken while forming a dummy pattern up to 30μm long in the wafer periphery where devices cannot be taken.

This invention also provides an exposure mask optimized for the above process.

According to this invention, a given shape of dummy pattern is formed in the wafer periphery where devices cannot be taken, so that film peeling during CMP, interconnection short-circuit and carrier contamination can be prevented. Furthermore, a data ratio for the dummy pattern may be optimized to prevent a polishing rate from being reduced during CMP.

DETAILED DESCRIPTION OF THE PREFERRED EMBODIMENTS

This invention will be specifically described, but not limited to, with reference to an example. Example 1

FIGS. 2 and 3 are process cross-sections illustrating an embodiment of this invention, where copper is used for an interconnection in the first layer.

Figure 1:
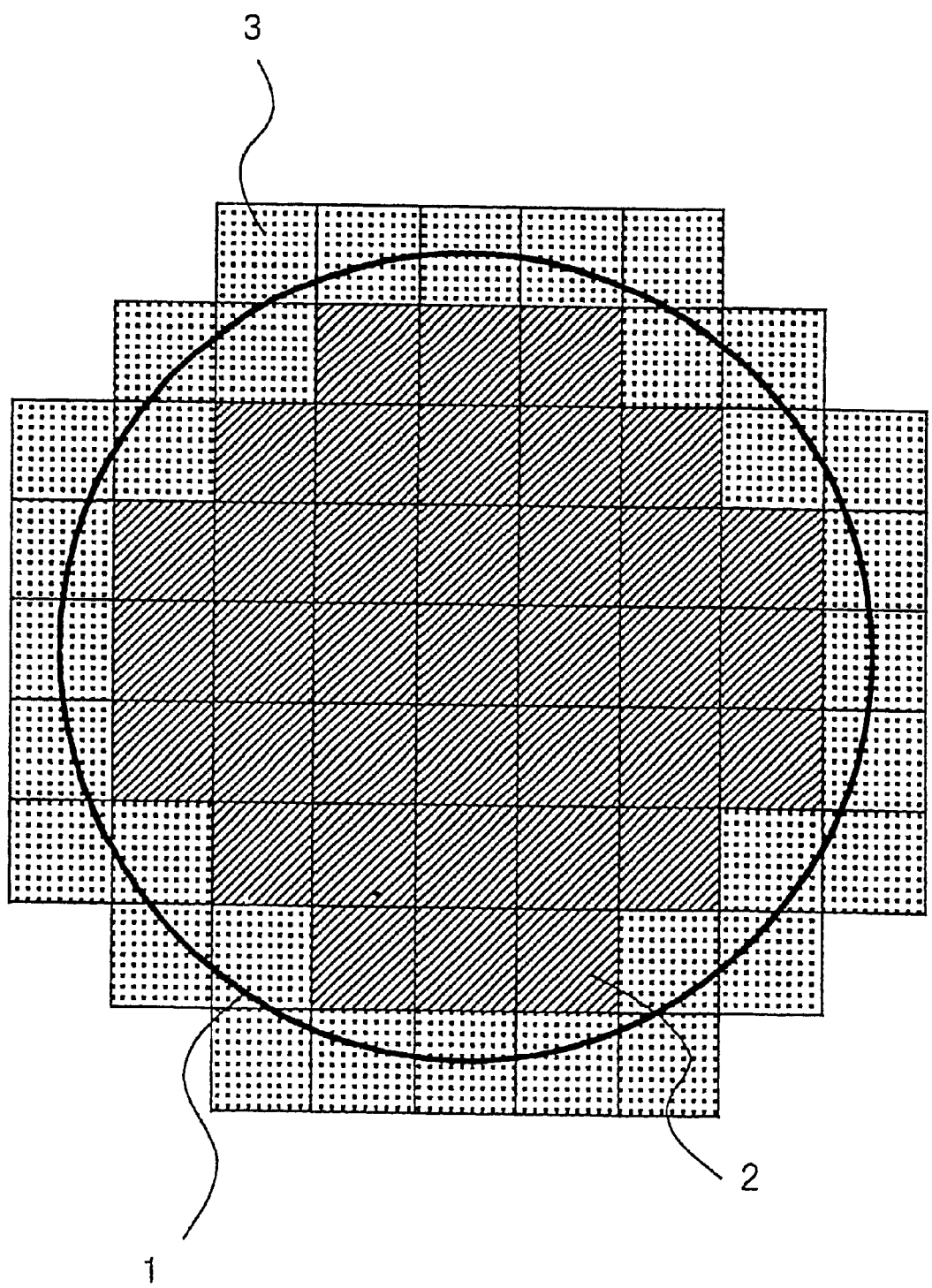
FIG. 1 is a conception diagram illustrating a configuration of masks used in the process of this invention.
Figure 2A:
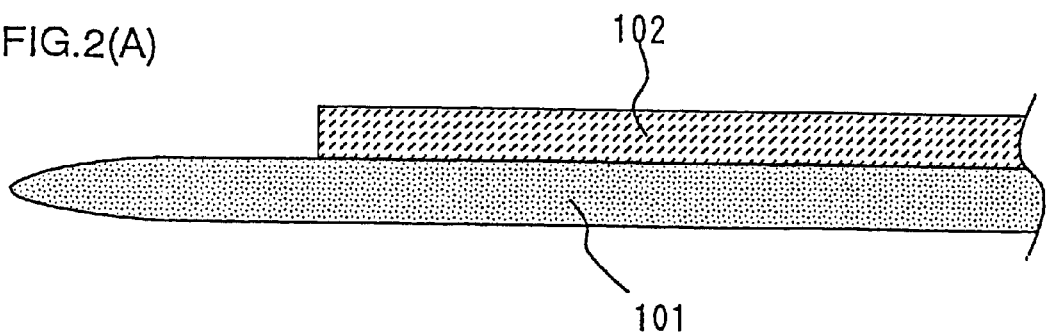
FIG. 2 is a process cross-section illustrating the first half of a process for forming a copper interconnection layer according to an embodiment of this invention.
Figure 2B:
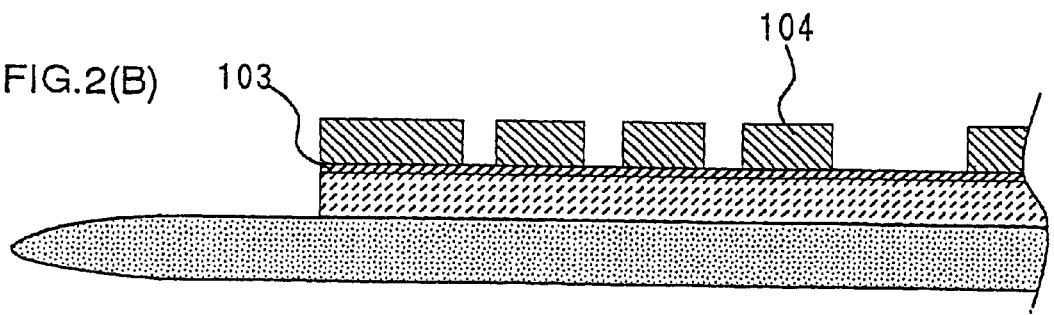

First, an insulating film 102 is deposited on a silicon substrate 101 having a transistor (unshown) and a contact hole (unshown) (FIG. 2(A)). On the film is deposited a stopper film 103 such as an SiN film to a thickness of about 50 nm, on which is then deposited a flat insulating film 104 consisting of a silicon oxide film to a thickness of about 400 nm for forming a groove in which copper is to be buried. On the film, a positive type of photoresist is applied. Then, the periphery and then the central part are exposed using two different masks having a reversed pattern and are developed to leave a resist pattern in the exposed area (unshown). The flat insulating film 104 is etched using the resist pattern as a mask to form a groove pattern as shown in FIG. 2(B). FIG. 1 shows the configuration of the two different masks used in exposure. The first mask 2 is for the device forming area in the inside of the wafer 1 and has a desired interconnection pattern. The second mask 3 has only a pattern consisting of identical rectangles. It is preferable to expose the periphery using the second mask 3 as described above and then expose the inside part from which products are to be taken, using the first mask 2 because a longer time from exposure to development may deteriorate a pattern resolution.

Figure 2C:
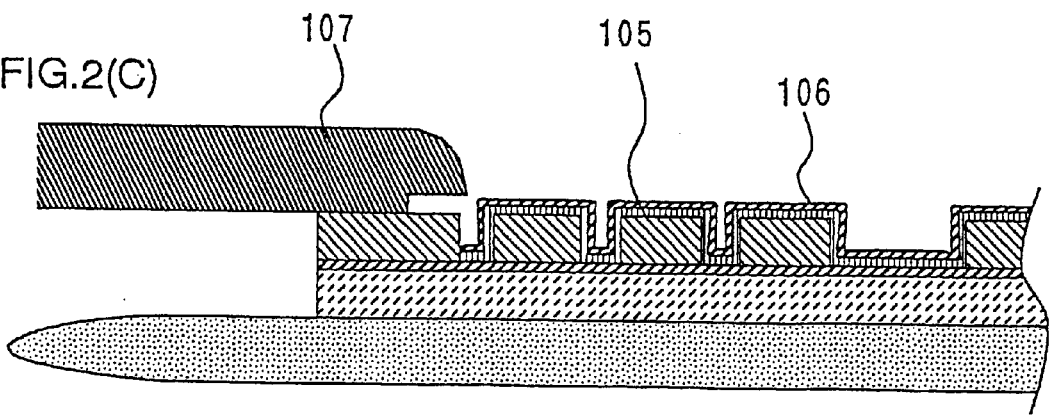

Then, the substrate having the groove pattern is placed in a spattering equipment. On the substrate are deposited by spattering a barrier film 105 consisting of a high-melting metal nitride such as TaN to about 20 nm and then a Cu film 106 to about 100 nm. During the process, the periphery of the wafer is held by a clamp 107 as shown in FIG. 2(C) for preventing the materials from going around to the rear face of the wafer.

Figure 3A:
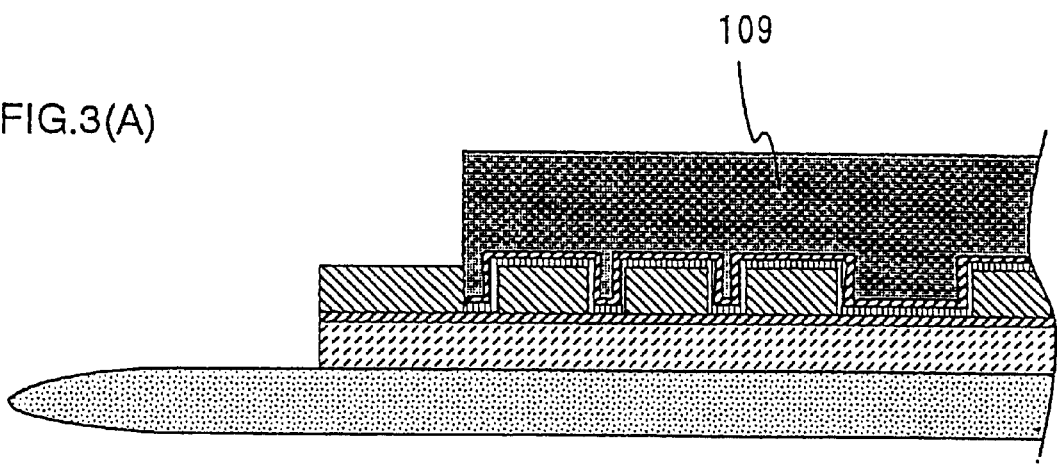
FIG. 3 is a process cross-section illustrating the latter half of the process for forming a copper interconnection layer according to the embodiment of this invention.
Figure 3B:
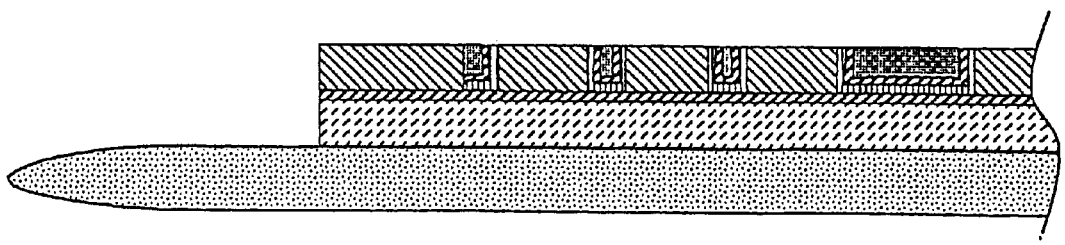

Then, copper is deposited by an appropriate technique such as electrolytic plating to a thickness of 800 nm (FIG. 3(A)). Subsequently, the plated copper 109, the spattered copper 106 and the barrier film 105 are polished by CMP until the surface of the groove oxide film 104 is exposed, the surface is flattened, and thereby copper is buried in the groove to give the structure shown in FIG. 3(B). The dummy pattern formed by periphery exposure will be described in detail.

Figure 4:
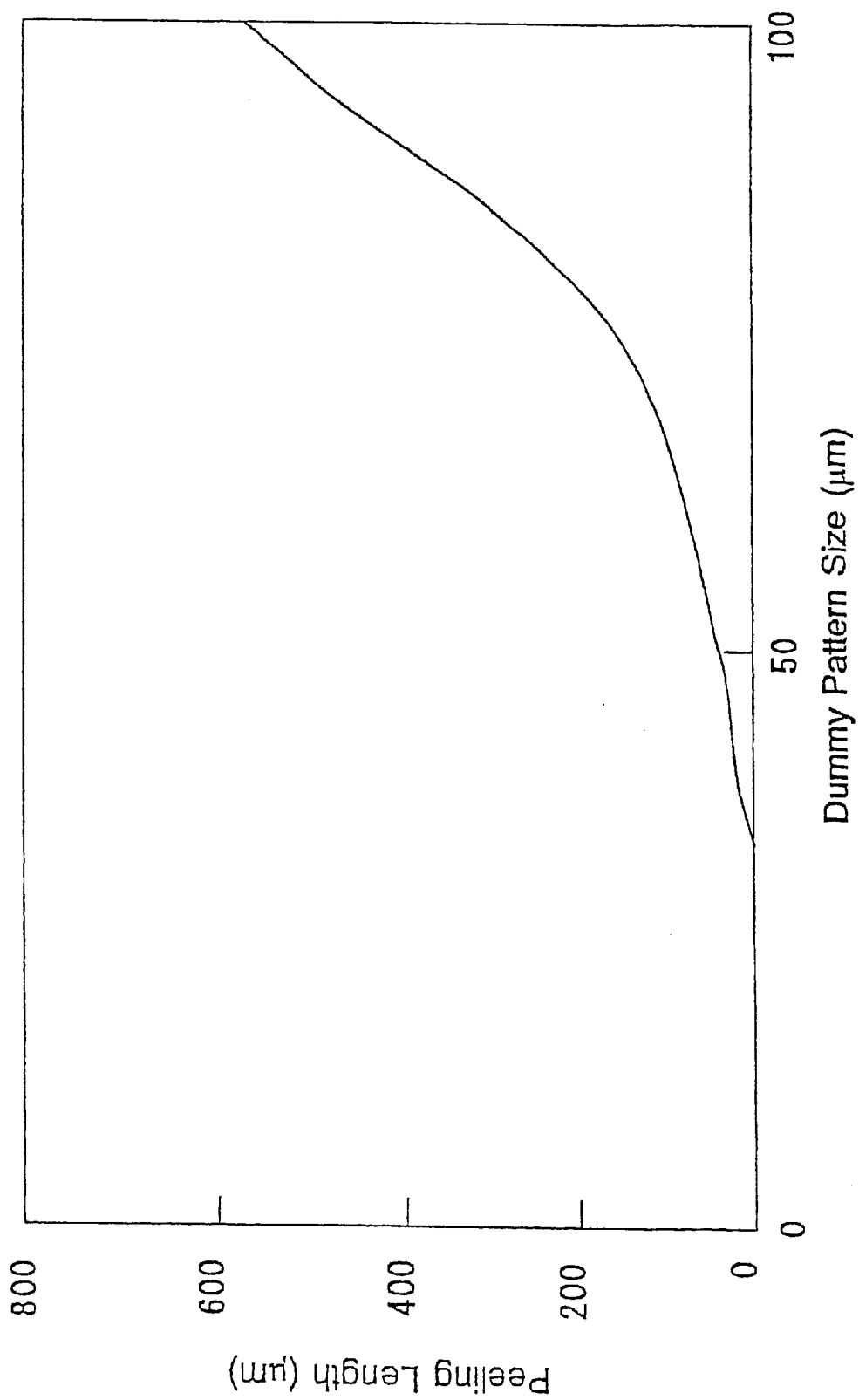
FIG. 4 is a graph showing change in a peeling length to a dummy-pattern size in a wafer periphery.

Dummy-pattern Size:

We investigated relationship of a peeling area to a dummy-pattern size, and the results are shown in FIG. 4. The results in the figure were obtained by forming a reversed pattern consisting of rectangular dots in a mask corresponding to a chip size of 25×25 mm; exposing the whole surface of a 200 mm wafer using the pattern; developing and etching the wafer; forming a barrier film and a spattered copper film as described above; conducting copper plating and then CMP; and microscopically observing the wafer periphery to determine a peeling length. It can be seen from the figure that the larger the size is, the longer the peeling length is and peeling little occur when the dot size is 30 μm or less. The dummy pattern size is limited to 30 μm less in the process of this invention. There are no restrictions to its lower limit as long as it is larger than twice the total thickness of the barrier film 105 and the spattered Cu film 106 for burying copper in the groove. For the above case, the size must be at least 0.25 μm for ensuring that it is larger than twice the thickness of {the barrier film (20 nm)+the spattered Cu film (100 nm)}. In practice, an exposure mask used for forming such a dummy pattern is designed according to a design rule for an interconnection pitch. Specifically, when an interconnection pitch is designed using a 0.28 μm rule, a dummy pattern is designed to have a size corresponding to an integral multiple (1-, 2-, . . . or n-fold) of the rule, i.e., 0.28, 0.56, . . . or 0.28 n μm. A pattern deviated from the design rule may be formed, but is not practical because a sequence for pattern checking becomes more complicated.

There are no limitations for the shape of the dummy pattern as long as each dummy pattern has a size up to 30 μm. It may be any shape such as square, rectangle, L-shape, cruciform and U-shape.

Figure 5:
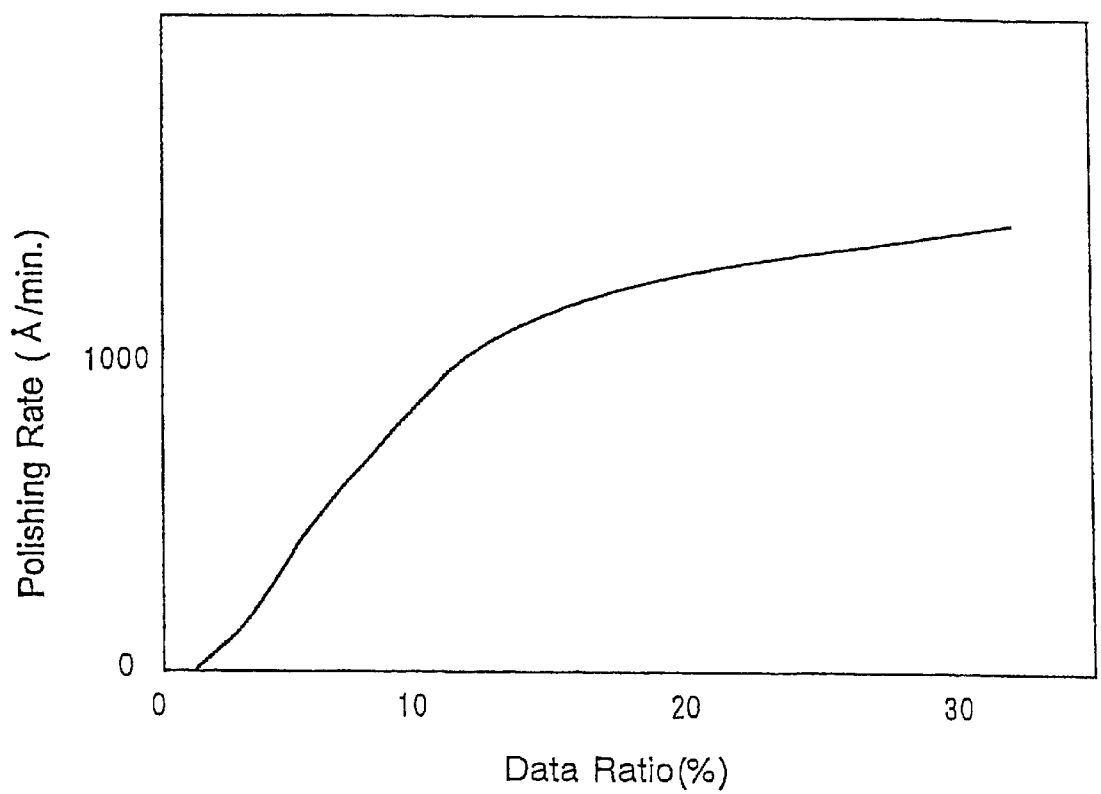
FIG. 5 is a graph showing change in a CMP polishing rate to a data ratio in a dummy pattern in the wafer periphery.
Figure 6:
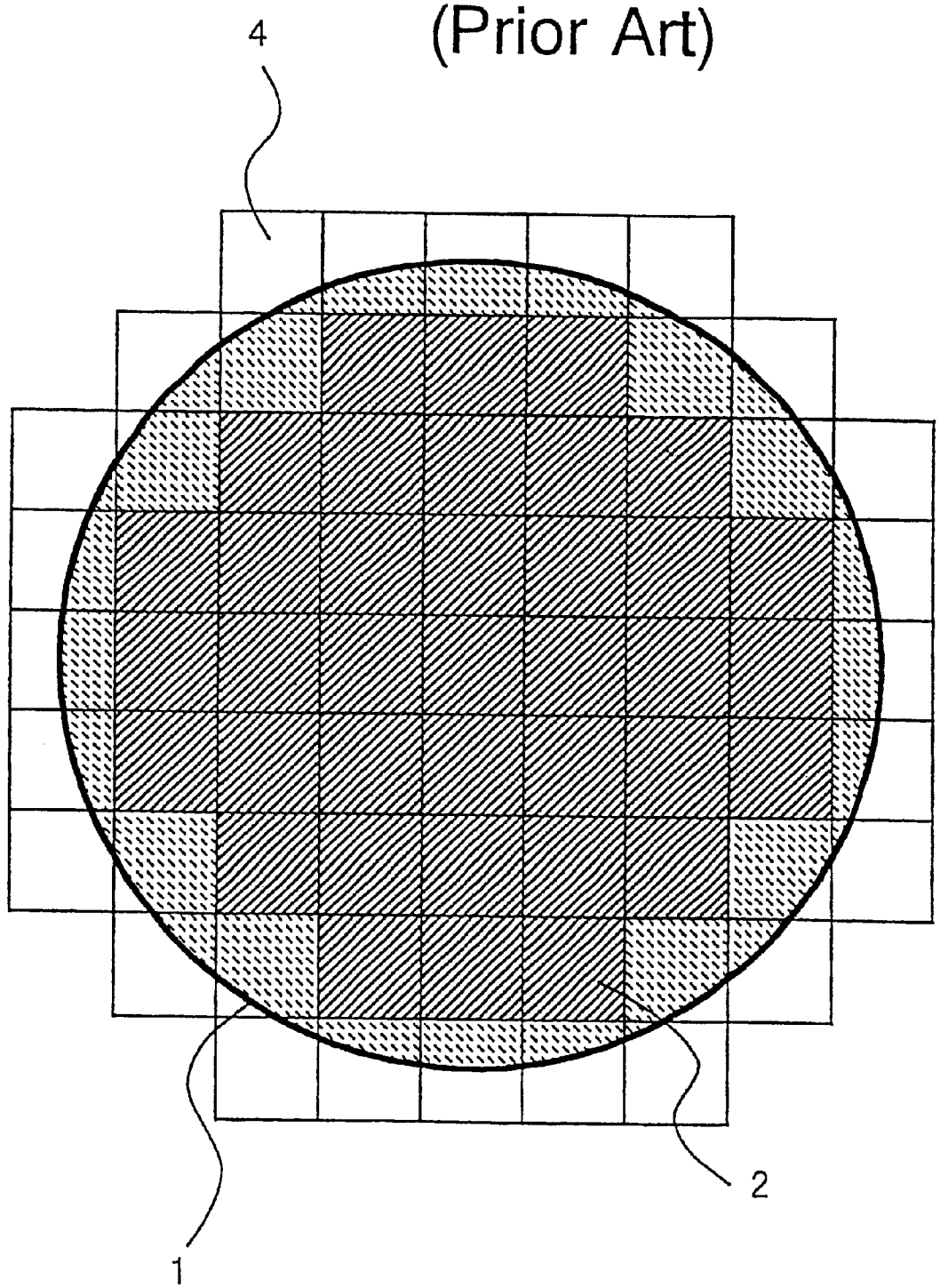
FIG. 6 is a conception diagram illustrating a mask configuration used in a conventional exposure process.
Figure 7:
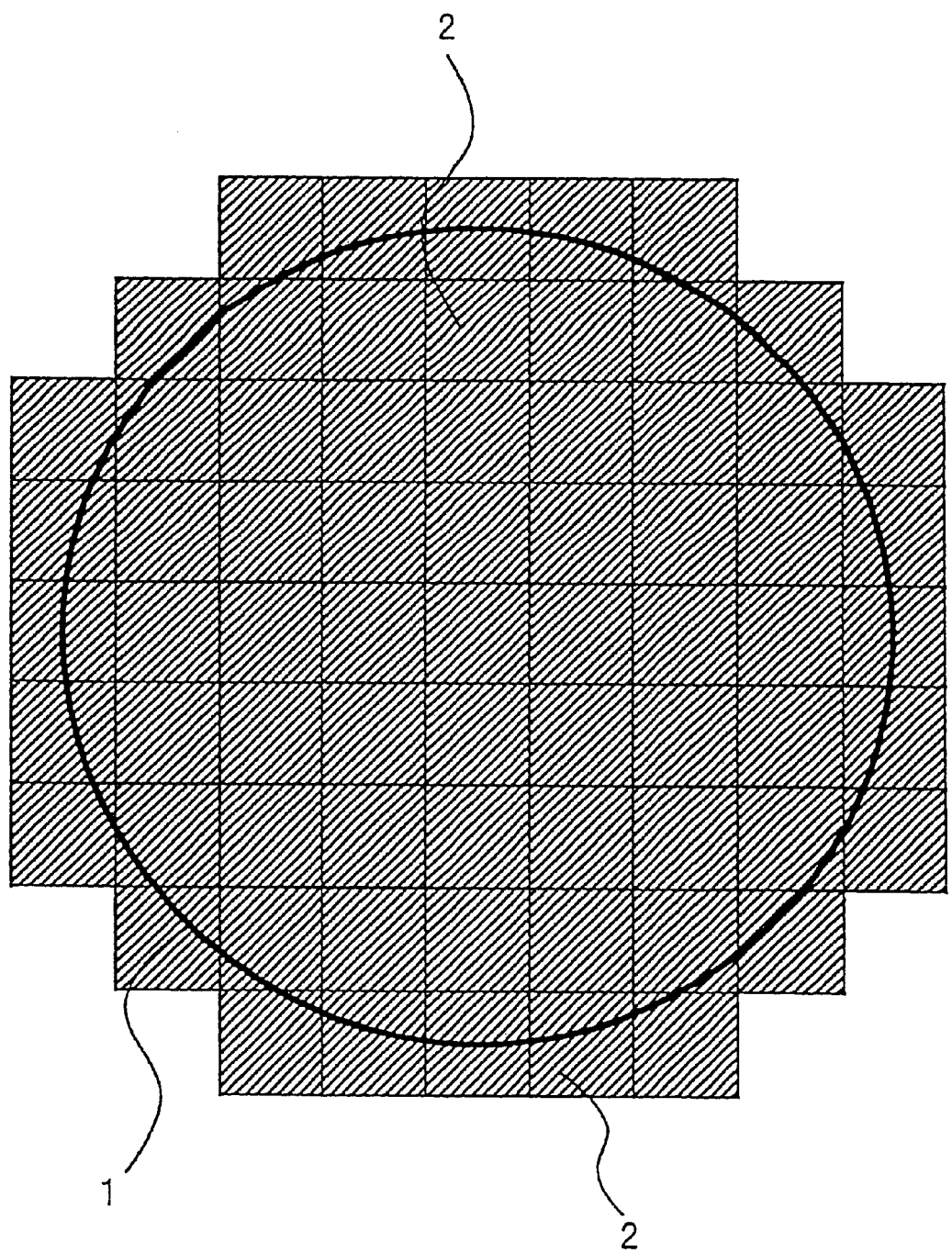
FIG. 7 is a conception diagram illustrating a mask configuration used in another conventional exposure process.
Figure 8A:
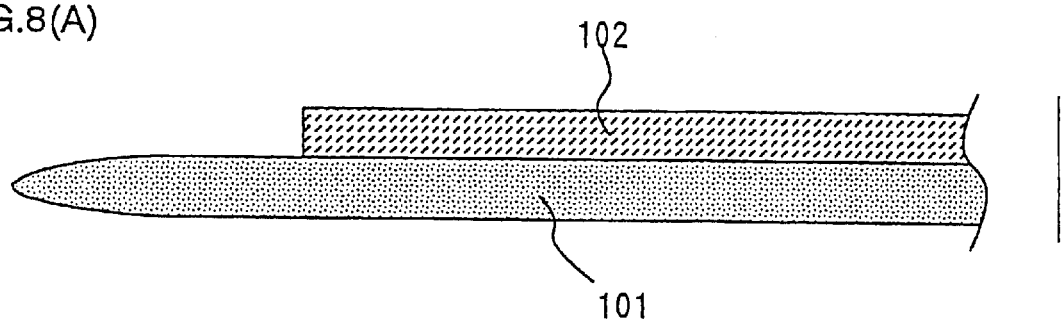
FIG. 8 is a process cross-section illustrating a conventional process for forming a copper interconnection layer.
Figure 8B:
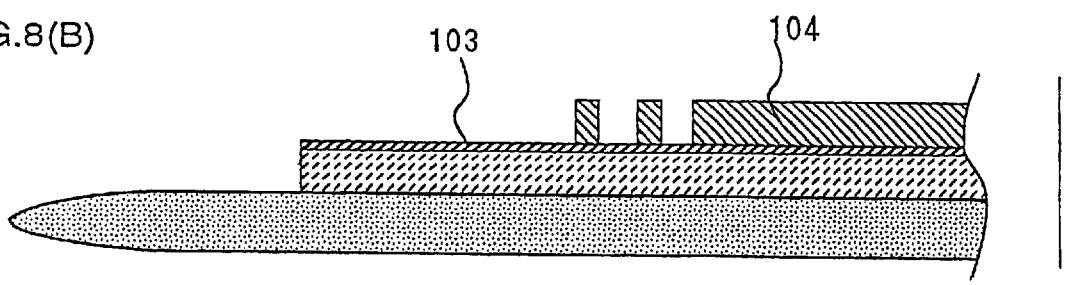
Figure 8C:
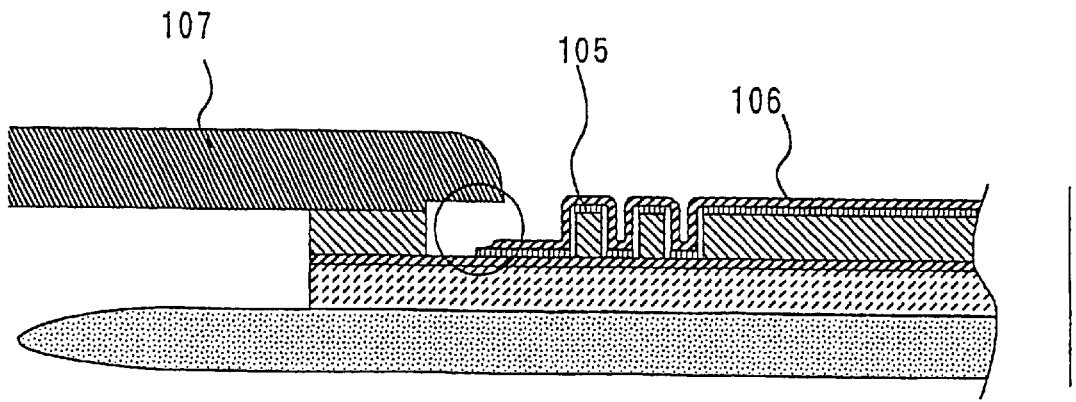
Figure 9A:
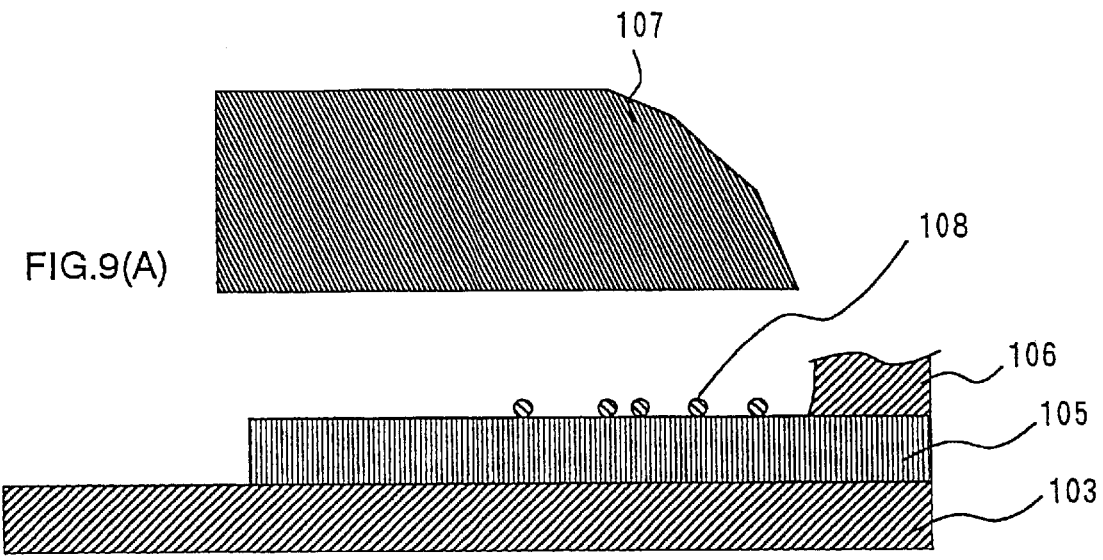
FIG. 9 is an enlarged cross-section illustrating the problems in the prior art.
Figure 9B:
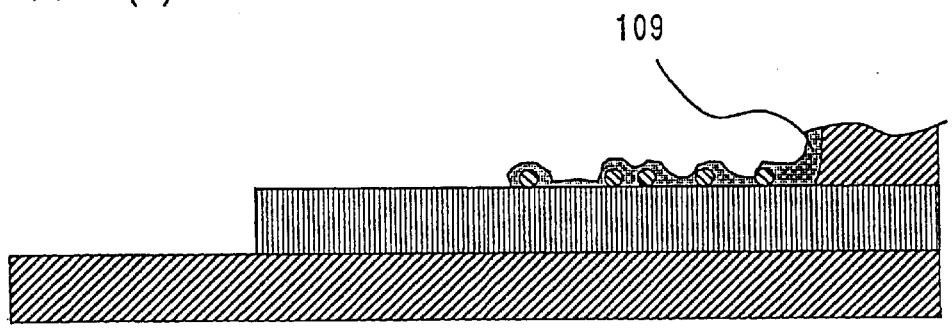
Figure 9C:
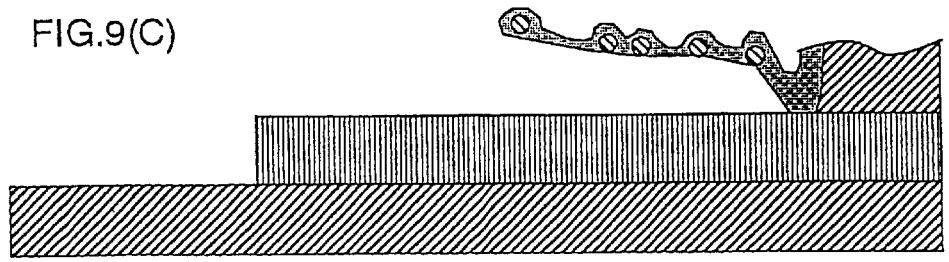

Data Ratio:

We investigated an effect of a ratio of the pattern area to the total area (data ratio) on a polishing rate during CMP. The results are shown in FIG. 5. The results indicate that the less the pattern is, the lower the polishing rate is and the higher the process load is. Since the polishing rate of 1000 Å/min or higher is practically sufficient, it is preferable that the data ratio is 10% or higher. There are no restrictions for the upper limit of the data ratio. However, it is generally about 30% because calculating a design for a mask used requires a longer time as the data ratio increases.

Thus, a copper damascene interconnection has been described. This invention is, however, not limited to the particular interconnection and may be applied to forming either an interconnection or contact plug by a damascene method.

In addition, there has been described pattern formation by photolithography using a mask, but a pattern may be formed by direct drawing using an electron beam.

What is claimed is:

1. An exposure mask for forming a dummy pattern in a peripheral edge region of a semiconductor wafer outside of a center area of the wafer where devices with groove patterns are formed, the exposure mask comprising a mask pattern corresponding to the dummy pattern to be formed in the peripheral edge region, the dummy pattern comprising plural shapes that are each no larger than 30 $\mu$m.

2. An exposure mask as claimed in claim 1 where the mask pattern is a mask corresponding to a pattern whose size is an integral multiple of the design rule for the semiconductor device.

3. An exposure mask as claimed in claim 1 where the mask pattern is a reversed pattern to the dummy pattern.

4. The exposure mask of claim 1, wherein all of the plural shapes are generally the same size and shape.

5. The exposure mask of claim 1, wherein each of the plural shapes has a minimum size that is greater than twice a sum of thicknesses of a barrier film and a metal film in the devices with groove patterns.

6. The exposure mask of claim 1, wherein each of the plural shapes comprises an oxide film in which the groove patterns are formed.

7. The exposure mask of claim 1, wherein the plural shapes are one of rectangular, L-shaped, cruciform, and U-shaped.

* * * * *